(12) United States Patent
Ikeda

(10) Patent No.: US 6,400,182 B2
(45) Date of Patent: Jun. 4, 2002

(54) SEMICONDUCTOR INTEGRATED CIRCUIT DEVICE AND METHOD OF LAYING OUT CLOCK DRIVER USED IN THE SEMICONDUCTOR INTEGRATED CIRCUIT DEVICE

(75) Inventor: Nobuyuki Ikeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/734,880

(22) Filed: Dec. 13, 2000

(30) Foreign Application Priority Data

Jul. 26, 2000 (JP) ........................................ 2000-225980

(51) Int. Cl.$^7$ ............................................... H01L 25/00
(52) U.S. Cl. ........................... 326/101; 326/47; 326/93; 326/95; 326/96; 326/102
(58) Field of Search .............................. 326/93, 95, 96, 326/101, 102, 47

(56) References Cited

U.S. PATENT DOCUMENTS

| | | | | |
|---|---|---|---|---|
| 4,958,092 A | * | 9/1990 | Tanaka | 307/480 |
| 5,045,725 A | * | 9/1991 | Sasaki | 307/465 |
| 5,341,049 A | * | 8/1994 | Shimizu et al. | 307/482.1 |
| 5,416,431 A | * | 5/1995 | Strauss | 326/95 |
| 5,497,109 A | * | 3/1996 | Honda | 326/93 |
| 5,818,263 A | * | 10/1998 | Ashuri | 326/93 |
| 5,969,544 A | * | 10/1999 | Iwao | 326/93 |
| 5,994,924 A | * | 11/1999 | Lee et al. | 326/93 |
| 6,054,872 A | * | 4/2000 | Fudanuki | 326/39 |

FOREIGN PATENT DOCUMENTS

| | | |
|---|---|---|
| JP | 4-64263 | 2/1992 |
| JP | 6-37607 | 2/1994 |
| JP | 11-191019 | 7/1999 |

\* cited by examiner

Primary Examiner—Michael Tokar
Assistant Examiner—Khai Nguyen
(74) Attorney, Agent, or Firm—Leydig, Voit & Mayer, Ltd.

(57) ABSTRACT

In a semiconductor integrated circuit, the number of rows of transistors in each of first driver circuits is increased or decreased using MOS transistors group in clock driver circuits regions arranged in an array, such as in portions of circuit cell regions into which a core region is divided, in order to supply clock signals to cell, such as a megacell, through a mesh of interconnected clock signal supply lines, in the core region.

12 Claims, 6 Drawing Sheets

SEMICONDUCTOR INTEGRATED CIRCUIT DEVICE AND METHOD OF LAYING OUT CLOCK DRIVER USED IN THE SEMICONDUCTOR INTEGRATED CIRCUIT DEVICE

FIELD OF THE INVENTION

The present invention relates to a semiconductor integrated circuit device having a plurality of clock driver circuits dispersedly arranged in a core region in a semiconductor integrated circuit, the clock driver circuits supplying appropriate clock signals to a plurality of cells using the clock signals and arranged in the core region, through clock signal supply lines interconnected in a mesh in the core region, and a method of trying out the clock driver circuits.

BACKGROUND OF THE INVENTION

Conventionally, in a semiconductor integrated circuit device such as an ECA (Embedded Cell Array) or a cell base, the interior region (core region) has two kinds of cells therein. That is, a plurality of cells acting as logic circuits, such as AND or OR circuits, and a plurality of cells acting as a flip-flop circuit or a memory circuit, each requiring clock signals, wherein a clock driver circuit is provided for supplying the clock signals to the cells such as the flip-flop circuit or the memory circuit.

FIG. 8 shows a constitution of a conventional semiconductor integrated circuit device. The semiconductor integrated circuit device 100 has a core region 101 (internal integrated circuit group) and a buffer region 102 (peripheral circuit region). A first signal driver circuit 103 (input driver) is located in the central portion of one side of the core region 101 to amplify a clock signal produced from outside of the semiconductor integrated circuit device 100. A plurality of second signal driver circuits 104 (104a-1 to 104a-4, 104b-1 to 104b-4, 104c-1 to 104c-4, 104d-1 to 104d-4) (main driver) are uniformly located in the core region 101 vertically and horizontally.

Third signal driver circuits 105a, 105b and fourth signal driver circuits 106a–106d (predrivers) are uniformly located between the first signal driver circuit 103 and the second signal driver circuits 104. A clock signal output by the first driver circuit 103 is supplied to the respective second signal driver circuits 104 in an even manner. A signal line 107 interconnects the first signal driver circuit 103 to the third driver circuits 105a, 105b. Further, signal line 108a interconnects the third signal driver circuit 105a to the fourth signal driver circuits 106a, 106b. The signal line 108b interconnects the third signal driver circuit 105b to the fourth driver circuits 106c, 106d. Further, signal lines 109a–109d interconnect the fourth signal driver circuits 106a–106d to each of the first signal driver circuits 104, respectively.

Clock signal supply lines 110-1 to 110-n belong to an interconnection line group consisting of lines arranged vertically in the core region 101. Clock signal supply lines 111-1 to 111-n belong to an interconnection line group consisting of lines arranged horizontally in the core region 101. The clock signal supply lines 110-1 to 110-n and the clock signal supply lines 111-1 to 111-n are connected in a cross relation to each other to form a mesh-like interconnection pattern. The second signal driver circuits 104 as mentioned above are uniformly located and connected to the mesh-like lines formed by the clock signal supply lines 110-1 to 110-n, 111-1 to 111-n. The clock signals supplied to the mesh-like interconnection lines are supplied to megacells 301a, 301b and flip-flop circuit cell groups 302, each requiring the clock signals in the core region 101.

Clock signals are supplied to the semiconductor integrated circuit device 100, and the clock signals output by the first signal driver circuit 103 are uniformly supplied to the second signal driver circuits 104 with the third signal driver circuits 105a, 105b and the fourth signal driver circuits 106a–106d symmetrically arranged to each other between the first signal driver circuit 103 and the second signal driver circuits 104, whereby the clock signals are uniformly supplied to the mesh-like clock signal supply lines 110-1 to 110-n and 111-1 to 111-n. This allows unevenness of the clock signals reaching the megacells 301a, 301b and the flip-flop circuit cell groups 302 in the core region 101 to be reduced, resulting in a variety of signal processes using clock signals with reduced clock skews in the internal integrated circuit groups in the core region 101.

In modern technology of semiconductor integrated circuit devices, however, there is always an increasing need for high-speed operations, and accordingly, semiconductor integrated circuit devices having clock driver circuits with considerably reduced clock skews are required. There are several problems with the above mentioned conventional semiconductor integrated circuit device, which may cause an inability to meet there requirements.

For example, as shown in FIG. 8, when the megacells 301a, 301b are unevenly arranged in the core region 101, or the flip-flop circuit cell groups 302 are densely or sparsely arranged therein, the signal supply load on each of the second signal driver circuits 104 widely vary for the megacells 301a, 301b and the flip-flop circuit cell groups 302. For this reason, the clock skews maybe increased for high-speed clock signals, even when the mesh-like interconnected clock signal supply lines 110-1 to 110-n and 111-1 to 111-n are used as shown in FIG. 8.

In this case, it can be a solution to reduce the clock skews that the megacells 301a, 301b and the flip-flop circuit cell groups 302 each requiring clock signals are re-arranged to provide a uniform signal supply load in the core region 101. However, this re-arrangement requires considerable time and labor for the layout and raises a problem of the delayed development of semiconductor integrated circuit devices.

SUMMARY OF THE INVENTION

It is an object of the present invention to provide a semiconductor integrated circuit device and a layout method of a clock driver considerably reducing clock skews without requiring the re-arrangement of cells in the core region 101, other than the clock driver circuit.

According to the semiconductor integrated circuit device of one aspect of the present invention an adjustment is carried out such that the plurality of clock driver circuits are arranged by increasing or decreasing the number of rows of transistors in each of the clock driver circuits based on the density of the cells using the clock signals in the neighboring regions of each of the dispersedly arranged clock driver circuits, by using MOS transistors of MOS transistor groups arranged in an array in the peripheral region and bounded region portions in a plurality of divided regions into which the core region is divided.

According to the semiconductor integrated circuit device of another aspect of the present invention, an adjustment is carried out such that the plurality of clock driver circuits are arranged by increasing or decreasing the number of clock driver circuits in the neighboring regions based on the density of the cells using the clock signals in the neighboring regions of each of the dispersedly arranged clock driver circuits, by using MOS transistors of MOS transistor groups arranged in an array in the peripheral region and bounded region portions in a plurality of divided regions into which the core region is divided.

According to the semiconductor integrated circuit device of still another aspect of the present invention, an adjustment is carried out such that the plurality of clock driver circuits are arranged by shifting each of the clock driver circuits based on the density of the cells using the clock signals in the neighboring regions of each of the dispersedly arranged clock driver circuits, by using MOS transistors of MOS transistor groups arranged in an array in the peripheral region and bounded region portions in a plurality of divided regions into which the core region is divided.

According to the semiconductor integrated circuit device of still another aspect of the present invention, an adjustment is carried out such that the plurality of clock driver circuits are arranged by making a combination of increasing or decreasing the number of rows of transistors in each of the clock driver circuits, increasing or decreasing the number of clock driver circuits, and/or shifting each of the clock driver circuits based on the density of the cells using the clock signals in the neighboring regions of each of the dispersedly arranged clock driver circuits, by using MOS transistors of MOS transistor groups arranged in an array in the peripheral region and bounded region portions in a plurality of divided regions into which the core region is divided.

According to the layout method of still another aspect of the present invention, an adjustment is carried out such that in the arrangement step MOS transistors of MOS transistor groups are arranged in an array in the peripheral region and bounded region portions in a plurality of divided regions into which the core region is divided, in the layout step a layout process for cells in the divided regions is processed, and in the number controlling step the number of rows of transistors in each of the clock driver circuits is increased or decreased based on the density of the cells using the clock signals in the neighboring regions of each of the dispersedly arranged clock driver circuits, by using the MOS transistors of the MOS transistor groups in an array in the arrangement step.

According to the layout method of still another aspect of the present invention, an arrangement is carried out such that in the arrangement step MOS transistors of MOS transistor groups are arranged in an array in the peripheral region and bounded region portions in a plurality of divided regions into which the core region is divided, in the layout step a layout process for cells in the divided regions is processed, and in the number controlling step the number of clock driver circuits in the neighboring regions is increased or decreased based on the density of the cells using the clock signals in the neighboring regions of each of the dispersedly arranged clock driver circuits, by using the MOS transistors of the MOS transistor groups in an array in the arrangement step.

According to the layout method of still another aspect of the present invention, an arrangement is carried out such that in the arrangement step MOS transistors of MOS transistor groups are arranged in an array in the peripheral region and bounded region portions in a plurality of divided regions into which the core region is divided, in the layout step a layout process for cells in the divided regions is processed, and in the sifting step each of the clock driver circuits is shifted based on the density of the cells using the clock signals in the neighboring regions of each of the dispersedly arranged clock driver circuits, by using the MOS transistors of the MOS transistor groups in an array in the arrangement step.

According to the layout method of still another aspect of the present invention, an arrangement is carried out such that in the arrangement step MOS transistors of MOS transistor groups are arranged in an array in the peripheral region and bounded region portions in a plurality of divided regions into which the core region is divided, in the layout step a layout process for cells in the divided regions is processed, and in the circuit arranging step a combination of increasing or decreasing the number of rows of transistors in each of the clock driver circuits, increasing or decreasing the number of clock driver circuits, and/or shifting each of the clock driver circuits is made based on the density of the cells using the clock signals in the neighboring regions of each of the dispersedly arranged clock driver circuits, by using the MOS transistors of the MOS transistor groups in an array in the arrangement step.

Other objects and features of this invention will become apparent from the following description with reference to the accompanying drawings.

DESCRIPTION OF THE PREFERRED EMBODIMENTS

Two preferred embodiments of a semiconductor integrated circuit and a setting arrangement method for a clock driver circuit used therein according to the present invention will be hereinafter described in detail with reference to the accompanying drawings.

Figure 1:
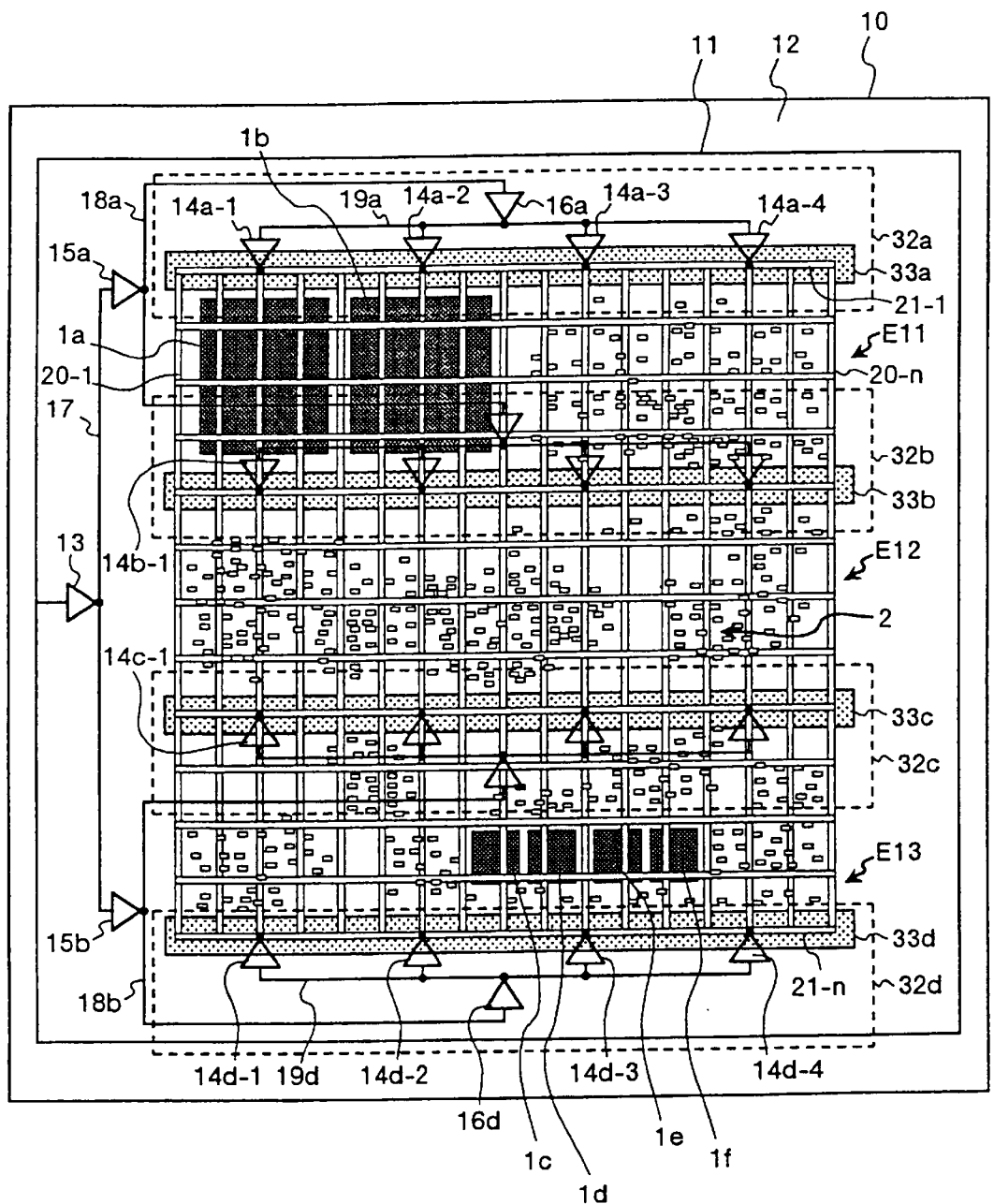
FIG. 1 shows a general constitution of a semiconductor integrated circuit device according to a first embodiment of the present invention.

FIG. 1 shows a general constitution of a semiconductor integrated circuit device according to a first embodiment of the present invention. The semiconductor integrated circuit device 10 has a core region 11 (internal integrated circuit group) and a buffer region 12 (peripheral circuit region). A second signal driver circuit 13 (input driver) is located in the central portion of one side of the core region 11 to amplify a clock signal produced from the outside of the semiconductor integrated circuit device 10. A plurality of first signal driver circuits 14 (14a-1 to 14a-4, 14b-1 to 14b-4, 14c-1 to 14c-4, 14d-1 to 14d-4) (main driver) are uniformly located in the core region 11 vertically and horizontally.

In first chip-layout, the core region 11 is divided into a plurality of circuit cell regions E11–E13, and a plurality of regions 32a–32d for clock driver circuits are provided in bounded regions alternating with the circuit cell regions E11–E13.

Third signal driver circuits 15a, 15b and fourth signal driver circuits 16a–16d (predrivers) are uniformly located between the second signal driver circuit 13 and the first signal driver circuits 14, and the clock signal produced from the second driver circuit 13 is supplied to the respective first signal driver circuits 14 in an even manner. A signal line 17 interconnects the second signal driver circuit 13 to the third driver circuits 15a, 15b. Further, signal lines 18a, 18b interconnect the third signal driver circuit 15a, 15b to the fourth signal driver circuits 16a–16d. Further, signal lines 19a–19d interconnect the fourth signal driver circuits 16a–16d to each of the first signal driver circuits 14, respectively. The first signal driver circuits 14 and the fourth signal driver circuits 16a–16d form clock driver circuits 33a–33d.

Clock signal supply lines 20-1 to 20-n belong to an interconnection line group consisting of lines arranged vertically extending in the core region 11. Clock signal supply lines 21-1 to 21-n belong to an interconnection line group consisting of lines arranged horizontally extending in the core region 11. The clock signal supply lines 20-1 to 20-n and the clock signal supply lines 21-1 to 21-n are connected in across relation to each other to form a mesh-like interconnection pattern. In chip-layout, the second signal driver circuits 14 as mentioned above are uniformly located on the mesh-like lines formed by the clock signal supply lines 20-1 to 20-n, 21-1 to 21-n.

A layout process is then performed for designing arrangement for cells in each of the circuit cell regions E11–E13 so as to produce the circuit cell regions E11–E13 with the cell arrangement shown in FIG. 1. Each of the circuit cell regions E11–E13 includes logic circuit cells such as AND circuits or OR circuits, flip-flop circuit cells requiring clock signals, and megacells such as memory circuits requiring clock signals such that the layout arrangement constituted thereof is determined. As a result, as shown in FIG. 1, for example, megacells 1a–1f and flip-flop circuit cell groups 2 are arranged.

Figure 2:
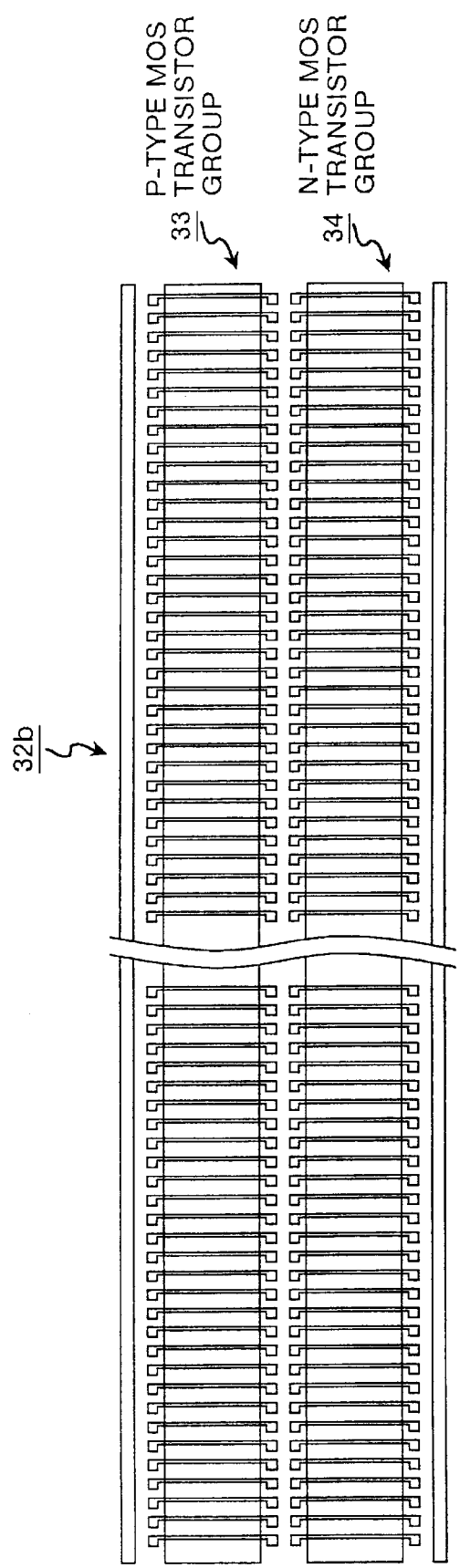
FIG. 2 shows a detailed constitution of a clock driver circuit region shown in FIG. 1.

A change in the circuit design is then made for the first signal driver circuit 14 in the clock driver circuits 33a–33d. The clock driver circuit regions 32a–32d have a P-type MOS transistor group 33 arranged in an array of P-type MOS transistors and an N-type MOS transistor group 34 arranged in an array of N-type MOS transistors and provided in parallel to the P-type MOS transistor group 33, as shown in FIG. 2.

Figure 3:
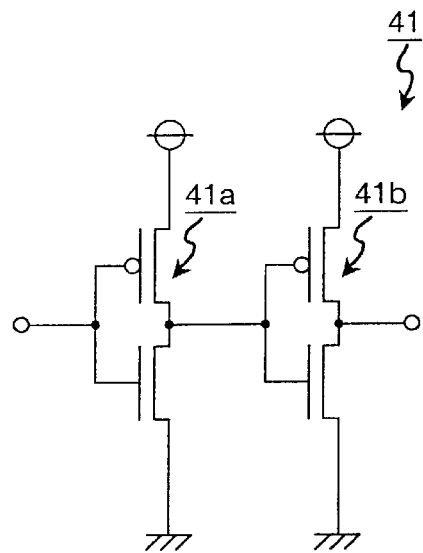
FIG. 3 shows a constitution of a first signal driver circuit shown in FIG. 1.

On the other hand, the first signal driver circuits 14 are basically constituted of inverter circuits 41a, 41b connected in two rows, as shown in FIG. 3. Since each inverter circuit 41a, 41b can be formed using a single P-type MOS transistor and a single N-type MOS transistor, it can be formed using two P-type MOS transistors and two N-type MOS transistors provided in the clock driver circuit regions 32a–32d mentioned above and positioned in which the first signal driver circuit 14 is disposed.

As mentioned above, since the cell arrangement in each of the circuit cell regions E11–E13 is layout designed out of consideration for the clock signal supply, the megacells 1a–1f and the flip-flop circuit cell groups 2 are unevenly disposed in the core region 11, causing the signal supply load supplied by each of the first signal driver circuits 14 to each cell to vary widely.

Figure 4:
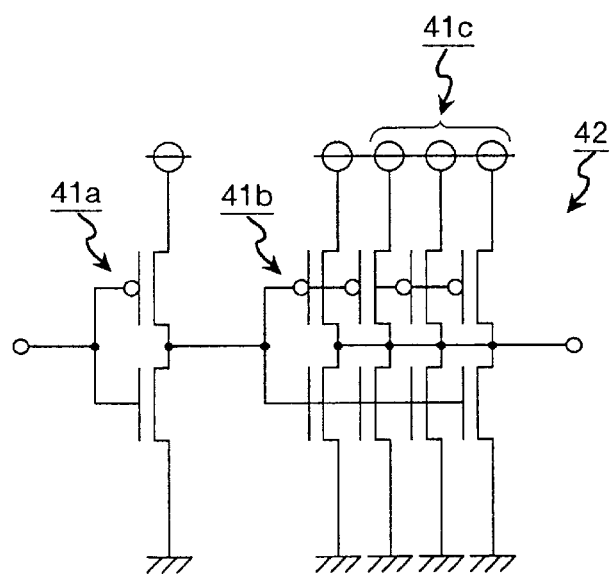
FIG. 4 shows a constitution of an increased number of rows of transistors in a first signal driver circuit shown in FIG. 1.

In this case, in the first embodiment, as shown in FIG. 4, the first signal driver circuit 41 is changed to a first signal driver circuit 42 consisting of three or more inverter circuits by connecting one or more inverter circuits 41c to the inverter circuit 41b forming the first signal driver circuit 41. As the signal supply load on the first signal driver circuit 14 becomes heavier, the number of inverter circuits is increased. This allows a reduction in clock skews without altering the layout arrangement of the circuit cell regions E11–E13. In other words, the controlled number of inverter circuits constituting the individual first signal driver circuit 14 results in the adjustment of the output drive capacity of the individual first signal driver circuit 14 to reduce the clock skews. The controlled number of inverter circuits can be easily achieved by using the P-type MOS transistors and N-type MOS transistors arranged in an array in the clock driver circuit regions 32a–32d.

Figure 5:
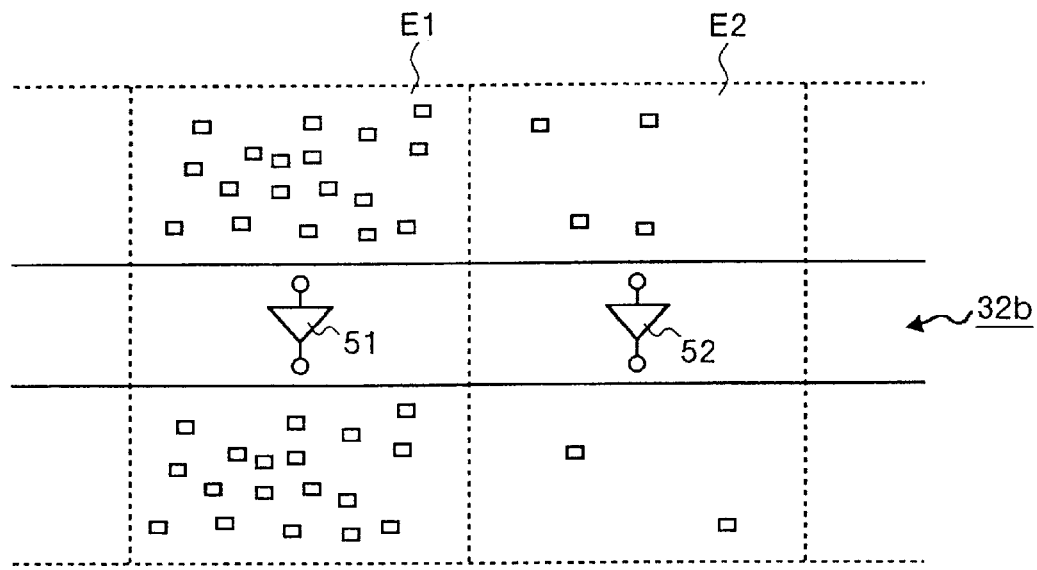
FIG. 5 shows a partial constitution of a semiconductor integrated circuit device according to the first embodiment of the present invention.

FIG. 5 is a schematic diagram which illustrated changing of the number of respective first signal driver circuits 14 according to the first embodiment. The first signal driver circuits 51, 52 are disposed in the clock driver region 32b at predetermined positions. When the layout design for the circuit cell regions E11–E13 has been completed, the density of cells with clock signals is judged for neighboring regions E1, E2 in the circuit cell region with respect to each of the first signal driver circuits 51, 52, and the number of transistors in each of the first signal driver circuits 51, 52 is then determined based on the density of the cells. Then, P-type MOS transistors and N-type MOS transistors arranged in an array are used to constitute the determined number of transistors. That is, the number of transistors, i.e., inverters, is increased when the first signal driver circuit 51 corresponding to neighboring region E1 in which the density of cells is relatively high, and the number of transistors is decreased when the first signal driver circuit 52 corresponding to the neighboring region E2 in which the density of cells is relatively low. The layout of the first signal driver circuits 51, 52 are performed using vias and interconnection layers other than the layers used for processing signals between the circuit cells.

Thus, the core region 11 is divided into the plurality of circuit cell regions E11–E13, and the clock driver circuit regions 32a–32d bounding the circuit cell regions E11–E13, and, after completion of the layout arrangement f or the circuit cell regions E11–E13, with the P-type MOS transistors and N-type MOS transistors arranged in an array, the number of transistors of the respective first signal driver circuits 14 is determined, based on the density of the cells within the neighboring regions E1, E2 of the respective first signal driver circuits 14. Therefore, according to the present invention, no change in the layout arrangement and interconnection of the circuit cell regions E11–E13 is required to considerably reduce unevenness of the signal supply load for the cells with clock signals, i.e., clock skews. In addition, a change in the number of transistors of the respective first signal driver circuits 14 can be made even in and after a slicing process in a gate array or the like, to obtain a good possibility of mask reduction in fabricating a semiconductor integrated circuit device.

A second embodiment of the present invention will now be explained. The number of transistors of the respective first signal driver circuits 14 can be changed based on the density of the cells in the neighboring regions E1, E2 of the respective first signal driver circuits 14 in the above mentioned first embodiment, while the number of the first signal driver circuits 14 in each of the neighboring regions E1, E2 can be increased or decreased in accordance with the density of the cells in the neighboring regions E1, E2 in the second embodiment.

Figure 6:
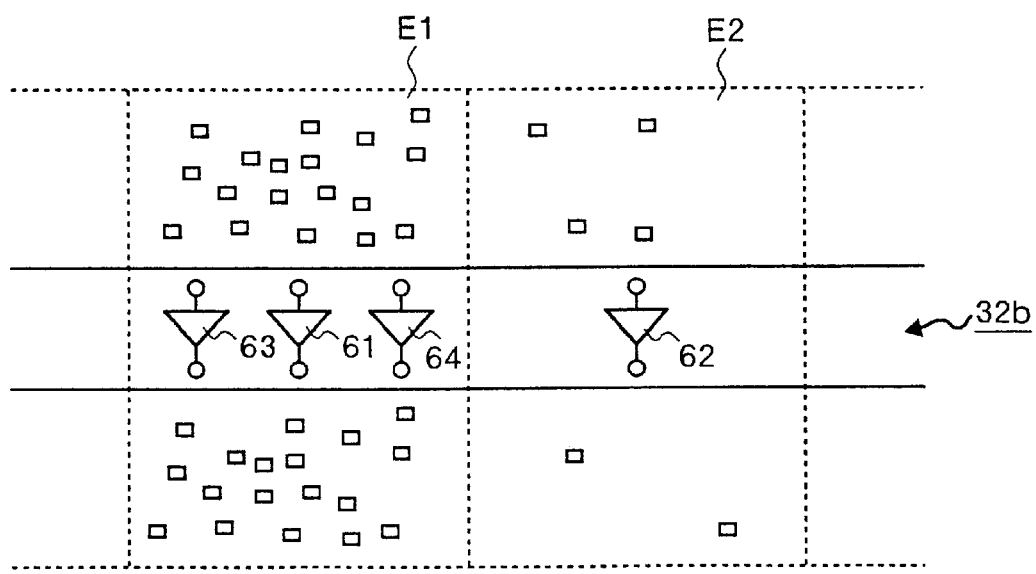
FIG. 6 shows a partial constitution of a semiconductor integrated circuit device according to a second embodiment of the present invention.

FIG. 6 is a schematic diagram which shows a portion of a semiconductor integrated circuit device constitution according to the second embodiment of the present invention. The general constitution of the semiconductor integrated circuit device is identical to that shown in FIG. 1. The first signal driver circuits 61, 62 are disposed in the clock driver region 32b at predetermined positions. These first signal driver circuits 61, 62 are also constituted of two rows of inverter circuits shown in FIG. 3.

When the layout design for the circuit cell regions E11–E13 has been completed, the density of cells with clock signals is judged for neighboring regions E1, E2 in the circuit cell region with respect to each of the first signal driver circuits 61, 62, and the number of the first signal driver circuits in the neighboring regions E1, E2 corresponding to the first signal driver circuits 61, 62 is determined based on the density of the cells. The first signal driver circuits in the neighboring regions E1, E2 are arranged by increasing or decreasing the number based on the determined number of the first signal driver circuits.

More specifically, additional first signal driver circuits 63, 64 are provided in addition to the first signal driver circuit 61 in the dense neighboring region E1, while no additional first signal driver circuit is provided in the sparse neighboring region E2, leaving the arrangement of the single first signal driver circuit 62. These first signal driver circuits 63, 64 are respectively constituted of the P-type MOS transistors and N-type MOS transistors arranged in an array, similar to the constitution of the first signal driver circuits 61, 62. In addition, each of the first signal driver circuits 61–64 includes two transistors. The layout of the first signal driver circuits 61–64 is performed using vias and interconnection layers other than the layers used for processing signals between the circuit cells.

Although each of the first signal driver circuits 61–64 has the same number of transistors in the second embodiment, this arrangement is exemplary, and similar to the first embodiment, any combination in which the number of transistors of each of the first signal driver circuits 61 to 64 can be increased or decreased based on the neighboring regions E1, E2 may be achieved.

Thus, the core region 11 is divided into the plurality of circuit cell regions E11–E13, and the clock driver circuit regions 32a–32d bounding the circuit cell regions E11–E13, and, after completion of the layout arrangement for the circuit cell regions E11–E13, with the P-type MOS transistors and N-type MOS transistors arranged in an array, the number of first signal driver circuits in the neighboring regions E1, E2 of each of the first signal driver circuits 14 is determined, based on the density of the cells with clock signals within the neighboring regions E1, E2. Therefore, according to the second embodiment of the present invention, no change in the layout arrangement and interconnection of the circuit cell regions E11–E13 is required to considerably reduce unevenness of the signal supply load for the cells with clock signals, i. e., clock skews. In addition, a change in the number of transistors of the respective first signal driver circuits 14 can be made even in and after a slicing process in a gate array or the like, to obtain a good possibility of mask reduction in fabricating a semiconductor integrated circuit device.

A third embodiment of the present invention will now be explained. The number of transistors of the respective first signal driver circuits 14 can be changed based on the density of the cells in the neighboring regions E1, E2 of the respective first signal driver circuits 14 in the first embodiment, while the position of each of the first signal driver circuits 14 can be shifted in accordance with the density of the cells in the neighboring regions E1, E2 in the third embodiment.

Figure 7:
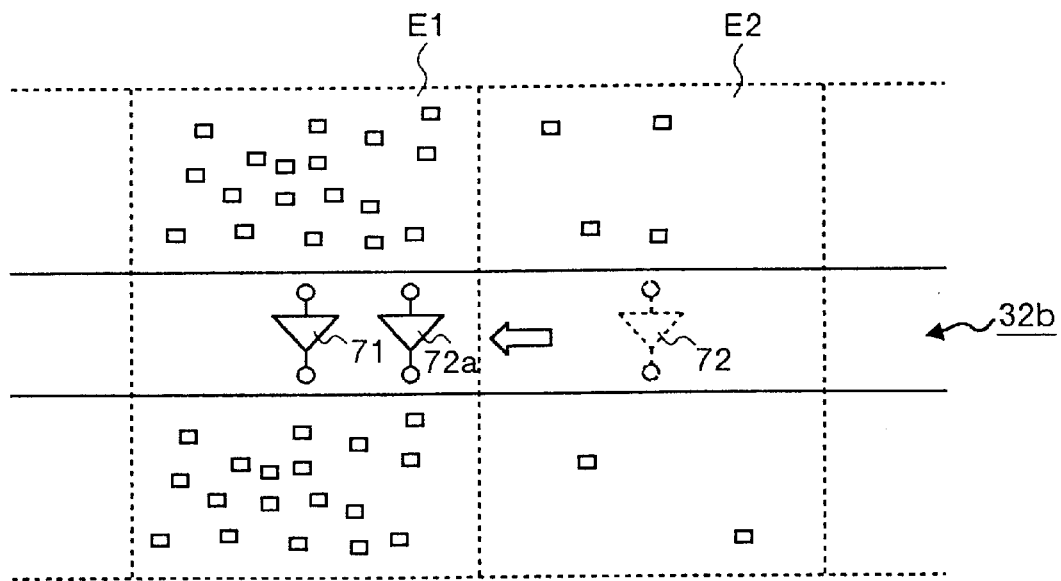
FIG. 7 shows a partial constitution of a semiconductor integrated circuit according to a third embodiment of the present invention.
Figure 8:
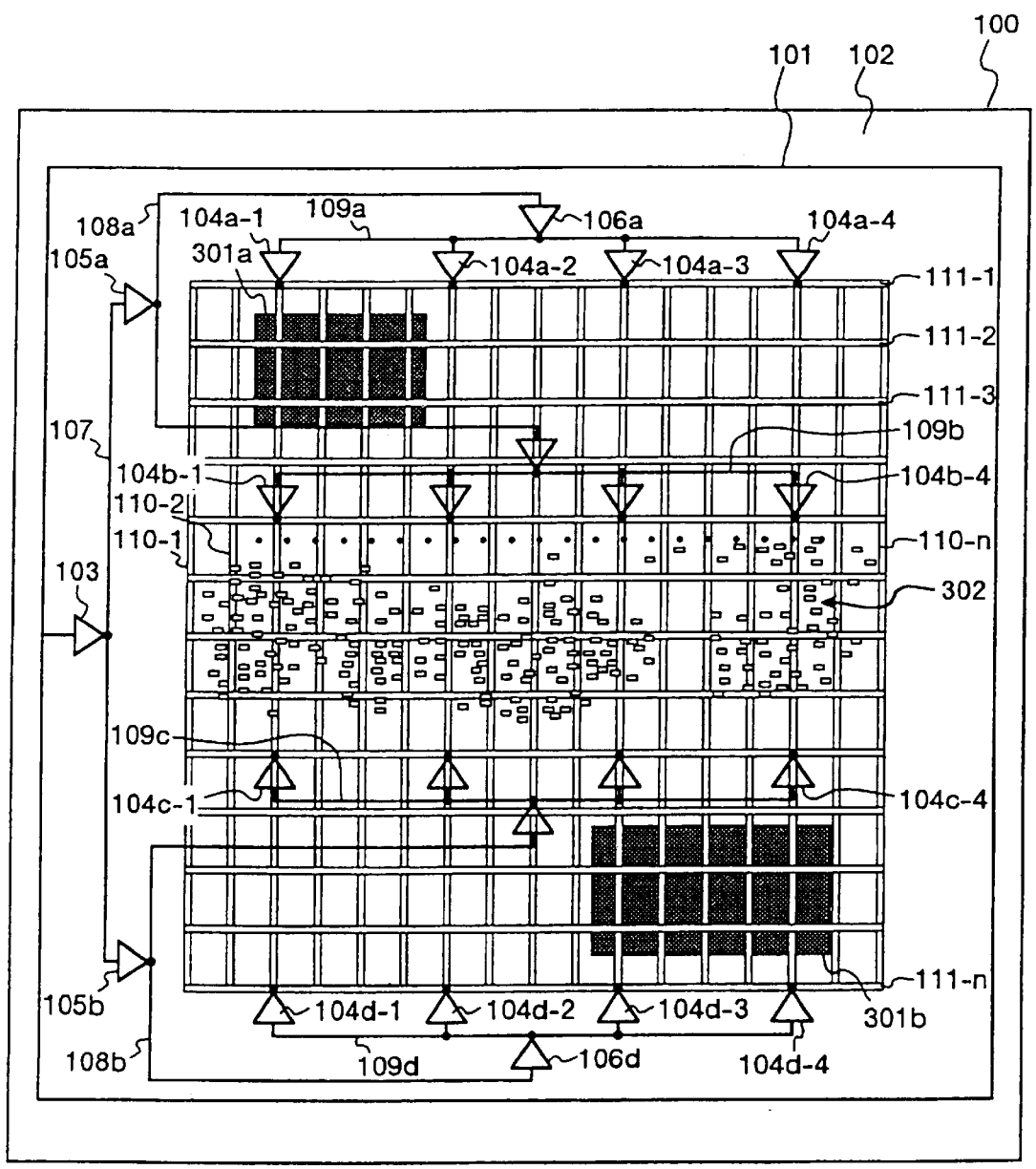
FIG. 8 shows a general constitution of a conventional semiconductor integrated circuit device.

FIG. 7 is a schematic diagram which shows a portion of a semiconductor integrated circuit device constitution according to the third embodiment of the present invention. The general constitution of the semiconductor integrated circuit device is identical to that shown in FIG. 1. The first signal driver circuits 71, 72 are disposed in the clock driver region 32b at predetermined positions. These first signal driver circuits 71, 72 are also constituted of two inverter circuits shown in FIG. 3.

When the layout design for the circuit cell regions E11–E13 has been completed, the density of cells with clock signals is judged for neighboring regions E1, E2 in the circuit cell region with respect to each of the first signal driver circuits 71, 72, and the positions to which the first signal driver circuits 71,72 are shifted in the clock driver circuit regions 32b are determined based on the density of the cells, so as to achieve the arrangement by shifting the first signal driver circuits 71, 72 to the determined positions.

More specifically, each of the first signal driver circuits 71, 72 is shifted and arranged such that the arrangement of the first signal driver circuits 71, 72 is determined based on the density of the neighboring regions E1, E2. Since the neighboring region E2 shown in FIG. 7 has a sparse region, the first signal driver circuit 72 is shifted and arranged at the side of the dense neighboring region E2 to be constituted as a first signal driver circuit 72a. On the other hand, the first signal driver circuit 71, which is in the dense neighboring region E1, is not shifted. However, depending on the number of first signal driver circuits which are shifted in the dense neighboring region E1, the first signal driver circuit may be shifted and arranged to the appropriate position as the first signal driver circuits shift.

This first signal driver circuit 72a is constituted of the P-type MOS transistors and N-type MOS transistors arranged in an array, similar to the constitution of the first signal driver circuits 71, 72. In addition, each of the first signal driver circuits 71, 72 includes two transistors. The layout of the first signal driver circuits 71, 72 is performed using vias and interconnection layers other than the layers used for processing signals between the circuit cells.

Although each of the first signal driver circuits 71, 72, and 72a has the same number of transistors and the total number of first signal driver circuits has no change in the third embodiment, this arrangement is exemplary, and similar to the first embodiment, any combination in which the number of transistors of each of the first signal driver circuits as well as the number of first signal driver circuits can be increased or decreased based on the neighboring regions E1, E2 may be achieved.

Thus, the core region 11 is divided into the plurality of circuit cell regions E11–E13, and the clock driver circuit regions 32a–32d bounding the circuit cell regions E11–E13, and, after completion of the layout arrangement for the circuit cell regions E11–E13, with the P-type MOS transistors and N-type MOS transistors arranged in an array, the positions to which the first signal driver circuits 71, 72 are shifted is determined, based on the density of the cells with clock signals within the neighboring regions E1, E2. Therefore, according to the third embodiment of the present invention, no change in the layout arrangement and interconnection of the circuit cell regions E11–E13 is required to considerably reduce unevenness of the signal supply load for the cells with clock signals, i.e., clock skews. In addition, a change in the number of transistors of the respective first signal driver circuits 14 can be made even in and after a slicing process in a gate array or the like, to obtain a good possibility of mask reduction in fabricating a semiconductor integrated circuit device.

As explained above, according to the semiconductor integrated circuit device of one aspect of the present invention, an arrangement is carried out such that the plurality of clock driver circuits are arranged by increasing or decreasing the number of transistors in each of the clock driver circuits based on the density of the cells using the clock signals in the neighboring regions of each of the dispersedly arranged clock driver circuits, by using MOS transistors of MOS transistor groups arranged in an array in the core region, which thus produces an effect of easily achieving a considerable reduction in the clock skews without requiring the rearrangement of cells in the core region, other than the clock driver circuit.

According to the semiconductor integrated circuit device of another aspect of the present invention, an arrangement is carried out such that the plurality of clock driver circuits are arranged by increasing or decreasing the number of clock driver circuits in the neighboring regions based on the density of the cells using the clock signals in the neighboring regions of each of the dispersedly arranged clock driver circuits, by using MOS transistors of MOS transistor groups arranged in an array in the peripheral region and bounded region portions in a plurality of divided regions into which the core region is divided, which thus produces an effect of easily achieving a considerable reduction in the clock skews without requiring the re-arrangement of cells in the core region other than the clock driver circuit.

According to the semiconductor integrated circuit device of still another aspect of the present invention, an adjustment is carried out such that the plurality of clock driver circuits are arranged by shifting each of the clock driver circuits based on the density of the cells using the clock signals in the neighboring regions of each of the dispersedly arranged clock driver circuits, by using MOS transistors of MOS transistor groups arranged in an array in the peripheral region and bounded region portions in a plurality of divided regions into which the core region is divided, which thus produces an effect of easily achieving a considerable reduction in the clock skews without requiring the re-arrangement of cells in the core region other than the clock driver circuit.

According to the semiconductor integrated circuit device of still another aspect of the present invention, an adjustment is carried out such that the plurality of clock driver circuits are arranged by making a combination of increasing or decreasing the number of transistors in each of the clock driver circuits, increasing or decreasing the number of clock driver circuits, and/or shifting each of the clock driver circuits based on the density of the cells using the clock signals in the neighboring regions of each of the dispersedly arranged clock driver circuits, by using MOS transistors of MOS transistor groups arranged in an array in the core region, which thus produces an effect of easily and flexibly achieving a considerable reduction in the clock skews without requiring the rearrangement of cells in the core region other than the clock driver circuit.

According to the layout method of still another aspect of the present invention, an arrangement is carried out such that in the arrangement step MOS transistors of MOS transistor groups are arranged in an array in the core region, in the layout step a layout process for cells in the regions is processed, and in the number controlling step the number of transistors in each of the clock driver circuits is increased or decreased based on the density of the cells using the clock signals in the neighboring regions of each of the dispersedly arranged clock driver circuits, by using the MOS transistors of the MOS transistor groups in the arrangement step, which thus produces an effect of easily achieving a considerable reduction in the clock skews without requiring the rearrangement of cells in the core region other than the clock driver circuit.

According to the layout method of still another aspect of the present invention, an arrangement is carried out such that in the arrangement step MOS transistors of MOS transistor groups are arranged in an array in the peripheral region and bounded region portions in a plurality of divided regions into which the core region is divided, in the layout step a layout process for cells in the divided regions is processed, and in the number controlling step the number of clock driver circuits in the neighboring regions is increased or decreased based on the density of the cells using the clock signals in the neighboring regions of each of the dispersedly arranged clock driver circuits, by using the MOS transistors of the MOS transistor groups in an array in the arrangement step, which thus produces an effect of easily achieving a considerable reduction in the clock skews without requiring the re-arrangement of cells in the core region other than the clock driver circuit.

According to the layout method of still another aspect of the present invention, an arrangement is carried out such that in the arrangement step MOS transistors of MOS transistor groups in an array in the core region, in the layout step a layout process for cells in the divided regions is processed, and in a shifting step, each of the clock driver circuits is shifted based on the density of the cells using the clock signals in the neighboring regions of each of the dispersedly arranged clock driver circuits, by using the MOS transistors of the MOS transistor groups in an array in the arrangement step, which thus produces an effect of easily achieving a considerable reduction in the clock skews without requiring the rearrangement of cells in the core region other than the clock driver circuit.

According to the layout method of still another aspect of the present invention, an arrangement is carried out such that in the arrangement step MOS transistors of MOS transistor groups are arranged in an array in the core region, in the layout step a layout process for cells in the divided regions is processed, and in the circuit arranging step a combination of increasing or decreasing the number of transistors in each of the clock driver circuits, increasing or decreasing the number of clock driver circuits, and/or shifting the clock driver circuits is made based on the density of the cells using the clock signals in the neighboring regions of each of the dispersedly arranged clock driver circuits, by using the MOS transistors of the MOS transistor groups in the arrangement step, which thus produces an effect of easily and flexibly achieving a considerable reduction in the clock skews without- requiring the re-arrangement of cells in the core region other than the clock driver circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device comprising:
a semiconductor integrated circuit having a core region including
  a plurality of clock driver regions,
  a plurality of circuit cell regions disposed between respective pairs of the clock driver regions, and
  a plurality of cells non-uniformly distributed in the circuit cell regions, each cell including at least one circuit receiving a clock signal;
  a plurality of clock signal supply lines located in the core region and connected in a mesh for distributing the clock signal to the cells; and
  a plurality of clock driver circuits located within respective clock driver regions and including rows of MOS transistors forming the clock driver circuits for supplying the clock signal to the cells proximate a respective clock driver circuit, wherein respective clock driver circuits comprise different numbers of the MOS transistors connected to form the respective clock driver circuits in accordance with the number of the cells supplied with the clock signal by the respective clock driver circuit, whereby clock skew is reduced.

2. A semiconductor integrated circuit device comprising:
a semiconductor integrated circuit having a core region including
  a plurality of clock driver regions,
  a plurality of circuit cell regions disposed between respective pairs of the clock driver regions, and
  a plurality of cells non-uniformly distributed in the circuit cell regions, each cell including at least one circuit receiving a clock signal;
  a plurality of clock signal supply lines located in the core region and connected in a mesh for distributing the clock signal to the cells; and
  a plurality of clock driver circuits located within respective clock driver regions and including rows of MOS transistors forming the clock driver circuits for supplying the clock signal to the cells proximate a respective clock driver circuit, wherein the clock driver circuits are non-uniformly distributed in the core region in accordance with the density of the cells supplied with the clock signal by the respective clock driver circuit, whereby clock skew is reduced.

3. The semiconductor integrated circuit according to claim 2 wherein respective clock driver circuits comprise different numbers of the MOS transistors connected to form the respective clock driver circuits in accordance with the number of cells supplied with the clock signal by the respective clock driver circuit.

4. A semiconductor integrated circuit device comprising:
a semiconductor integrated circuit having a core region including
  a plurality of clock driver regions,
  a plurality of circuit cell regions disposed between respective pairs of the clock driver regions, and
  a plurality of cells non-uniformly distributed in the circuit cell regions, each cell including at least one circuit receiving a clock signal;
  a plurality of clock signal supply lines located in the core region and connected in a mesh for distributing the clock signal to the cells; and
  a plurality of clock driver circuits located within respective clock driver regions and including rows of MOS transistors forming the clock driver circuits for supplying the clock signal to the cells proximate a respective clock driver circuit, wherein a fixed number of the clock driver circuits are located in the core region and positions of the clock driver circuits vary in the core region in accordance with the density of the cells supplied with the clock signal by the respective clock driver circuit, whereby clock skew is reduced.

5. A method of laying out clock driver circuits of a semiconductor integrated circuit device including a semiconductor integrated circuit having a core region including a plurality of clock driver regions, a plurality of circuit cell regions disposed between respective pairs of the clock driver regions, a plurality of cells non-uniformly distributed in the circuit cell regions, each cell including at least one circuit receiving a clock signal, a plurality of clock signal supply lines located in the core region and connected in a mesh for distributing the clock signal to the cells, and a plurality of clock driver circuits located within respective clock driver regions and including rows of MOS transistors for forming the clock driver circuits for supplying the clock signal to the cells proximate a respective clock driver circuit, the method comprising:
  laying out the cells of the circuit cell regions and the clock driver circuits in the clock driver regions; and
  changing the number of the transistors from the rows of MOS transistors in respective clock driver circuits in accordance with the number of the cells supplied with the clock signal by the respective clock driver circuit, whereby clock skew is reduced.

6. A method of laying out clock driver circuits of a semiconductor integrated circuit device including a semiconductor integrated circuit having a core region including a plurality of clock driver regions, a plurality of circuit cell regions disposed between respective pairs of the clock driver regions, a plurality of cells non-uniformly distributed in the circuit cell regions, each cell including at least one circuit receiving a clock signal, a plurality of clock signal supply lines located in the core region and connected in a mesh for distributing the clock signal to the cells, and a plurality of clock driver circuits located within respective clock driver regions and including rows of MOS transistors for forming the clock driver circuits for supplying the clock signal to the cells proximate a respective clock driver circuit, the method comprising:
  laying out the cells of the circuit cell regions and the clock driver circuits in the clock driver regions; and
  changing the number of clock driver circuits supplying the clock signal to respective cells in accordance with the density of the cells supplied with the clock signals by the respective clock driver circuit, whereby clock skew is reduced.

7. The method according to claim 6, including changing the number of the transistors from the rows of MOS transistors in respective clock driver circuits in accordance with the number of the cells supplied with the clock signal by the respective clock driver circuit.

8. A method of laying out clock driver circuits of a semiconductor integrated circuit device including a semiconductor integrated circuit having a core region including a plurality of clock driver regions, a plurality of circuit cell regions disposed between respective pairs of the clock driver regions, a plurality of cells non-uniformly distributed in the circuit cell regions, each cell including at least one circuit receiving a clock signal, a plurality of clock signal supply lines located in the core region and connected in a mesh for distributing the clock signal to the cells, and a plurality of clock driver circuits located within respective clock driver regions and including rows of MOS transistors for forming the clock driver circuits for supplying the clock signal to the cells proximate a respective clock driver circuit, the method comprising:

laying out the cells of the circuit cell regions and the clock driver circuits in the clock driver regions; and shifting clock driver circuits from supplying the clock signal to a first group of cells to supply the clock signal to a second, neighboring group of cells where the cell density in the second neighboring group of cells is higher than in the first group of cells, whereby clock skew is reduced.

9. The method according to claim 8, including changing the number of the transistors from the rows of MOS transistors in respective clock driver circuits in accordance with the number of the cells supplied with the clock signal by the respective clock driver circuit.

10. The method according to claim 8, including changing the number of clock driver circuits supplying the clock signal to respective cells in accordance with the density of the cells supplied with the clock signals by the respective clock driver circuit.

11. The method according to claim 10, including changing the number of the transistors from the rows of MOS transistors in respective clock driver circuits in accordance with the number of the cells supplied with the clock signal by the respective clock driver circuit.

12. A method of laying out clock driver circuits of a semiconductor integrated circuit device including a semiconductor integrated circuit having a core region including a plurality of clock driver regions, a plurality of circuit cell regions disposed between respective pairs of the clock driver regions, a plurality of cells non-uniformly distributed in the circuit cell regions, each cell including at least one circuit receiving a clock signal, a plurality of clock signal supply lines located in the core region and connected in a mesh for distributing the clock signal to the cells, and a plurality of clock driver circuits located within respective clock driver regions and including rows of MOS transistors for forming the clock driver circuits for supplying the clock signal to the cells proximate a respective clock driver circuit, the method comprising:

laying out the cells of the circuit cell regions and the clock driver circuits in the clock driver regions so that a fixed number of clock driver circuits are present in the core region; and changing positions of the clock driver circuits in the core regions and supplying the clock signal to respective cells in accordance with the density of the cells supplied with the clock signals by the respective clock driver circuit, whereby clock skew is reduced.

* * * * *